United States Patent [19]

Legendre et al.

[11] 4,119,923

[45] Oct. 10, 1978

[54] DISTORTION CORRECTOR FOR WIDE-BAND TRANSISTORIZED AMPLIFICATION STAGES

[75] Inventors: Philippe Legendre; Jean-Marie Nef, both of Paris, France

[73] Assignee: Thomson-CSF, Paris, France

[21] Appl. No.: 851,804

[22] Filed: Nov. 15, 1977

[30] Foreign Application Priority Data

Nov. 19, 1976 [FR] France ................ 76 34913

[51] Int. Cl.² .................. H03F 1/08; H03F 3/10; H03F 3/19

[52] U.S. Cl. .................. 330/284; 330/149; 330/283; 330/305; 330/311

[58] Field of Search .............. 330/94, 95, 283, 284, 330/305, 311, 145, 149; 307/320; 328/162

[56] References Cited

U.S. PATENT DOCUMENTS

| | | | |
|---|---|---|---|
| 3,509,480 | 4/1970 | Hiekman | 330/283 |
| 3,533,020 | 10/1970 | Hecht | 307/320 X |
| 3,614,644 | 10/1971 | Lieberman | 330/283 X |
| 3,952,260 | 4/1976 | Pruchazka et al. | 328/162 X |

OTHER PUBLICATIONS

Taub, "Differential Amplifier With High Input Impedance", *IBM Technical Disclosure Bulletin*, vol. 9, No. 11, Apr. 1967, pp. 1637-1638.

*Primary Examiner*—James B. Mullins
*Attorney, Agent, or Firm*—Cushman, Darby & Cushman

[57] ABSTRACT

Corrector consisting in arranging, in the circuit of an electrode of a transistor, or between two transistorized stages, of an amplifier to be corrected, a circuit equipped with at least one varactor in parallel with a resistance and fed by the current flowing through the transistor or transistors under a source impedance which is sufficiently low by comparison with that of this circuit, the effects of the variation in the capacitance of the varactor or varactors, in dependence upon the signal, compensating those due to this varactor effect.

1 Claim, 2 Drawing Figures

DISTORTION CORRECTOR FOR WIDE-BAND TRANSISTORIZED AMPLIFICATION STAGES

This invention relates to distortion correctors for wide-band amplifiers and particularly for coaxial cable repeaters.

The transmission of information by carrier currents over large distances necessitates the cascading of a large number of line amplifiers (up to several hundred) which are intended to compensate the attenuation of coaxial cables.

These amplifiers have to satisfy very stringent requirements in order to reach the quality objectives recommended by the CCITT, particularly in regard to the intermodulation distortion including that of order 3 which is particularly troublesome, particularly because it increases with the square of the number of repeaters.

One of the major causes of intermodulation distortion in transistorized amplifiers is the varactor effect of the transistors, which is reflected in a variation in the base-collector capacitance of the transistors at the rhythm of the signal, and creates an intermodulation distortion which increases in dependence upon the frequency and power level; this latter is important in the case of the transistors of the output stages of high-capacity line repeaters.

It is known that these deficiences can be overcome by using transistors specially designed for that. They operate with high currents and biassing voltages and by simultaneously effecting a global correction of the amplifier either by negative feedback or by a so-called "feed-forward" circuit which corrects the amplified signal by reinjecting the sole products of distortion into the output signal in phase opposition.

These arrangements are attended by the drawback of involving the use of special, and therefore expensive, transistors which increase the consumption of the repeater whilst at the same time reducing its reliability correlatively, and the use of a correction circuit which is made difficult by the phasing necessities which it involves, quite apart from the problems of stability which arise if the correction circuit is of the negative feedback type.

The object of the present invention is considerably to reduce these requirements both in regard to the special performances of the transistors and their consumption and in regard to the number of corrections which may remain necessary and which therefore become easier to effect, this reduction being made possible by carrying out a simple correction at the actual level of at least one of the transistorized stages responsible for all the distortions.

According to the invention, there is provided a distortion corrector for a wide-band transistorized amplifier having at least a transistor, the base collector space capacitance C of which is variable in dependence upon the amplitude of the current passing through it, comprising at least one circuit having a capacitive impedance in parallel with a resistance, said circuit being inserted into said amplifier in such a way that it is traversed by the current to be amplified under a source impedance which is low by comparison with the impedance of said circuit, and said capacitive impedance being formed by at least one element having a capacitance which is variable in dependence upon the voltage established at its terminals.

The invention will be better understood from the following description in conjunction with the accompanying drawing, wherein.

Figure 1:
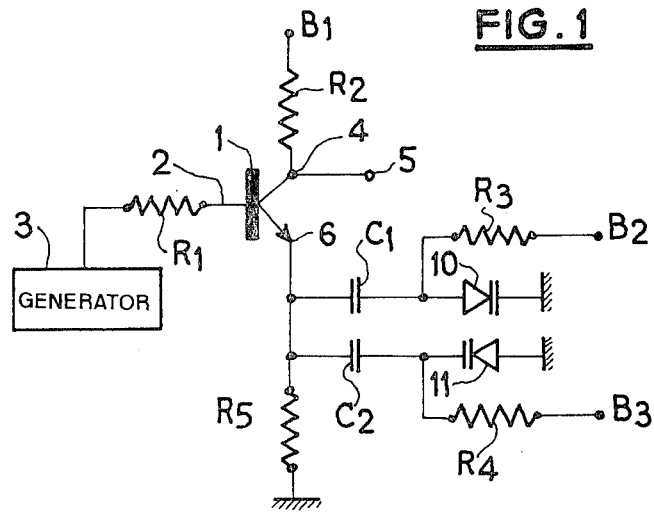
FIG. 1 is a circuit diagram of one example of application of the corrector, according to the invention, to an amplifier stage equipped with a transistor having a common emitter circuit.

In FIG. 1, an NPN transistor 1 receives at its base 2 an a.c. voltage delivered by a generator 3 of internal resistance $R_1$. Its collector 4 is connected to an output terminal 5 and to a positive biassing voltage $B_1$ through a resistor $R_2$. Its emitter 6 is connected to earth through a resistor $R_5$ and to one of the plates of capacitors $C_1$ and $C_2$ of which the others are connected to earth respectively through the anode-cathode space of a varactor 10 and the cathode-anode space of a varactor 11. A negative biassing source $B_2$ supplies the anode of the varactor 10 through a resistor $R_3$ whilst a positive biassing source $B_3$ supplies the cathode of the varactor 11 through a resistor $R_4$.

This amplifier stage, having a common emitter circuit, delivers the signals applied to its base 2 in amplified form at its output 5.

Its base-collector junction is the seat of a parasitic varactor effect which may be represented by an equivalent circuit diagram formed by a variable parasitic capacitor $C_p$ varying in the opposite direction to the voltage of the signal which is applied to it through a resistance $R_p$.

With respect to a transmitted signal of pulsation $\omega$, this network has a transfer function $T_p$ such that $$T_p = \frac{1}{1 + jR_p C_p \omega} \quad (1)$$

where $C_p$ has a law of variation in dependence upon the voltage V which is at its terminals and which is a characteristic peculiar to the transistor used. It has the following form:

$$C_p = C_o(1 + aV + bV^2 + \ldots)$$

where $C_o$ is the value of the capacitance $C_p$ at rest in the absence of an a.c. signal, $a$ and $b$ parameters representative of the non-linearity of the system, which are respectively responsible for the intermodulation distortion of order 2 by linear variation of the capacitance in dependence upon the amplitude of the signal and for the intermodulation distortion of order 3 by variation, at the second degree, of this same capacitance.

These distortions are compensated by a correction circuit according to the invention inserted into the emitter circuit of the transistor 1. In this circuit, the capacitors $C_1$ and $C_2$ have an insulating function with respect to the biassing by d.c. voltages $B_2$ and $B_3$, they show a negligible impedance to the amplified alternating currents. The resistors $R_3$ and $R_4$ are selected with very high values by comparison with the impedances of the varactors 10 and 11 to these same currents which therefore see an impedance $Z_E$ of the emitter circuit formed by the resistor $R_5$ in parallel with a variable capacitance $C_V$ formed by the varactors 10 and 11 connected head-to-tail, thus giving the following relation:

$$Z_E = \frac{1}{1 + jR_5C_v\omega}$$

where $\omega$ is the pulsation of the alternating current transmitted.

If the current gain $\beta$ of the transistor is very much greater than one and if the internal resistance $R_1$ of the generator 3 is negligible by comparison with the product $\beta Z_E$, the gain of the stage, i.e. the ratio of the voltage collected at the terminals of the load resistor $R_2$ to that supplied by the generator 3 is given by $$b = \frac{R_2}{Z_E} = \frac{R_2}{R_5}(1 + jR_5C_v\omega)$$

There is thus obtained a transfer function $$T_v = \frac{1}{R_5}(1 + jR_5C_v\omega) \quad (2)$$

of the current flowing through this correction network which is the opposite of the transfer function $T_p$ of the distorting network expressed by relation (1) above.

The transfer functions $T_v$ and $T_p$ are in series in the circuit and the resulting transfer function $T_R$ is expressed by the product $T_v \times T_p$, i.e.

$$T_R = K\frac{1 + jR_5C_v\omega}{1 + jR_pC_p\omega}$$

The distortion will be eliminated if $T_R$ is independent of $C_v$ and $C_p$ which will be the case if $R_5 = R_p$ and if $C_v = C_p$, this latter equality determining the choice of the varactors 10 and 11 and their operating points ensured by the voltages $B_2$ and $B_3$.

The following FIGURE shows a different circuit in which the correction network according to the invention acts as a connection between an input transistor having a common collector circuit and an output transistor having a common base circuit.

Figure 2:
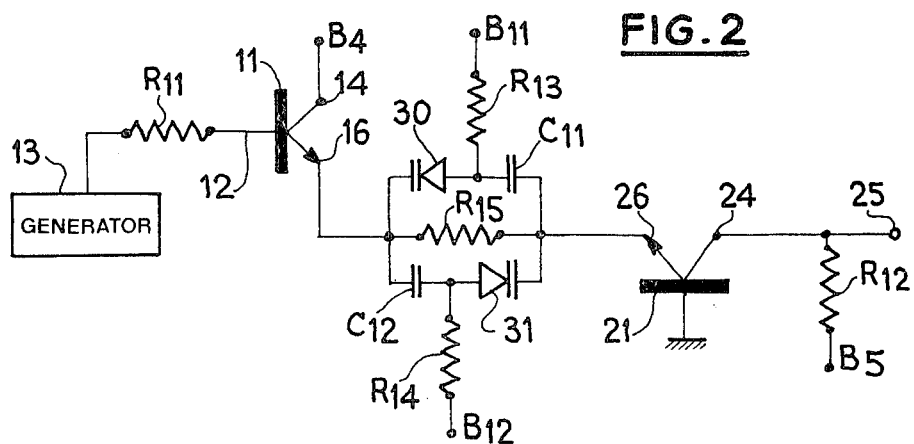
FIG. 2 shows a variant of FIG. 1 applied to a stage having a common collector circuit followed by a stage having a common base circuit.

In FIG. 2, an NPN transistor 11 receives at its base 12 an a.c. voltage supplied by a generator 13 of internal resistance $R_{11}$. Its collector 14 is connected to a positive voltage source $B_4$ and its emitter 16 is connected, through a resistor $R_{15}$, to the emitter 26 of a transistor 21 of which the base is connected to earth and of which the collector 24 is connected to an output terminal 25 and to a positive voltage source $B_5$ through a load resistor $R_{12}$. A correction circuit, similar to that shown in the preceding FIGURE, comprises in parallel, between the emitters 16 and 26, the cathode-anode space of a varactor 30 in series with a capacitor $C_{11}$, and a capacitor $C_{12}$ in series with the anode-cathode space of a varactor 31 in addition to the already mentioned resistor $R_{15}$. Finally, the anodes of the varactors 30 and 31 are respectively connected to negative voltage sources $B_{11}$ and $B_{12}$ through corresponding resistors $R_{13}$ and $R_{14}$.

If the current gains of each transistor are significantly greater than one, if the source resistance $R_{11}$ is negligible, and taking into account the fact that the input impedance of the transistor 21, having a common base circuit, is low by comparison with that of the correction circuit, the voltage gain may be expressed as follows:

$$G = R_{12}/Z_F$$

where $Z_F$ is the impedance of the emitter circuit of the transistor 11 which, under the assumptions made, is limited to that of the correction circuit, namely:

$$Z_F = \frac{R_{15}}{1 + jR_{15}C'_v\omega}$$

where $C'_v$ is the capacitance formed by the varactors 30 and 31 connected head-to-tail.

Accordingly, the conditions here are the same as in the circuit shown in FIG. 1, $C'_v$ having, in this case, to be selected to compensate the varactor effect resulting from the two transistors 11 and 12.

The circuits described have been tested with type 2N5109 MOTOROLA transistors and with type MV1404 MOTOROLA hyperabrupt varactors. These types of transistors have resulted in two varactors connected head-to-tail being included in the correction circuit, although this is only one of the possible arrangements.

Other types of varactors and series and/or parallel connections of these varactors might be necessary with different transistors.

Similarly, it is pointed out that, if the feed of the corrector by an emitter circuit readily enables the need for a low internal source resistance to be satisfied, the corrector may also be differently connected, in particular between the collector of a first transistor and the base of a second transistor, provided that the first transistor has a sufficiently low load resistance and that the second transistor is a transistor operating with high currents so that it has a low input impedance.

Experience has shown that the circuits described above enable the intermodulation power to be decreased by 10 dB for all the frequencies of the range of applications of the wide-band amplifiers thus equipped.

What we claim, is:

1. A corrector for a wide band transistorized amplifier having at least two cascaded amplification stages comprising a first transistor which has a common collector circuit and of which the emitter circuit is coupled with that of a second transistor having a common base circuit through first and second varactors of which the cathodes are respectively connected to the emitters of said first and second transistors, each anode of said first and second varactors being respectively connected on the one hand to the emitter of said second and first transistors through an insulating capacitor and on the other hand to two adjustable biassing sources.

* * * * *